(12) United States Patent
Padilla Alcaide et al.

(10) Patent No.: US 9,483,725 B2
(45) Date of Patent: Nov. 1, 2016

(54) SEMICONDUCTOR DEVICE INCLUDING A RADIO FREQUENCY IDENTIFICATION TAG

(71) Applicant: Infineon Technologies AG, Neubiberg (DE)

(72) Inventors: Jose Javier Padilla Alcaide, Unteraching (DE); Carlos Castro Serrato, Unterhaching (DE)

(73) Assignee: Infineon Technology, Neubiberg (DE)

( * ) Notice: Subject to any disclaimer, the term of this patent is extended or adjusted under 35 U.S.C. 154(b) by 0 days.

(21) Appl. No.: 14/927,042

(22) Filed: Oct. 29, 2015

(65) Prior Publication Data

US 2016/0140433 A1    May 19, 2016

(30) Foreign Application Priority Data

Oct. 31, 2014   (DE) ........................ 10 2014 115 886

(51) Int. Cl.
*G06K 19/077* (2006.01)
(52) U.S. Cl.
CPC ............................ *G06K 19/07758* (2013.01)
(58) Field of Classification Search
USPC ........................................ 235/492, 376, 493
See application file for complete search history.

(56) References Cited

U.S. PATENT DOCUMENTS

| | | | |
|---|---|---|---|
| 6,036,099 A | 3/2000 | Leighton | |
| 2002/0067268 A1* | 6/2002 | Lee ................ | G06K 19/0726 340/572.7 |
| 2004/0185682 A1* | 9/2004 | Foulke ............. | G03F 1/38 438/800 |
| 2006/0212096 A1* | 9/2006 | Stevenson ........ | A61N 1/37211 607/60 |
| 2008/0150701 A1 | 6/2008 | Randmae | |
| 2008/0203550 A1* | 8/2008 | Ewe ................ | H01L 23/4334 257/675 |
| 2009/0114714 A1* | 5/2009 | Huang ............. | G06Q 10/08 235/376 |
| 2009/0200650 A1 | 8/2009 | Tan | |
| 2009/0289376 A1 | 11/2009 | Chien et al. | |
| 2011/0062237 A1* | 3/2011 | Chaves ............ | G06K 19/06018 235/454 |
| 2011/0186980 A1 | 8/2011 | Lin | |
| 2011/0267086 A1 | 11/2011 | Pagani | |
| 2012/0126016 A1 | 5/2012 | Yang et al. | |
| 2013/0244739 A1 | 9/2013 | Arkko et al. | |
| 2014/0232274 A1 | 8/2014 | Atzmony et al. | |

* cited by examiner

*Primary Examiner* — Allyson Trail
(74) *Attorney, Agent, or Firm* — Murphy, Bilak & Homiller, PLLC

(57) ABSTRACT

A device includes a semiconductor element and a radio frequency identification (RFID) tag. The RFID tag is configured to provide information about at least one of a property of the device and a property of a manufacturing of the device.

12 Claims, 4 Drawing Sheets

SEMICONDUCTOR DEVICE INCLUDING A RADIO FREQUENCY IDENTIFICATION TAG

PRIORITY CLAIM

This application claims priority to German Patent Application No. 10 2014 115 886.5 filed on 31 Oct. 2014, the content of said application incorporated herein by reference in its entirety.

TECHNICAL FIELD

The invention relates to semiconductor devices including a radio frequency identification (RFID) tag. In addition, the invention relates to methods for manufacturing and operating such devices.

BACKGROUND

Semiconductor assemblies may include multiple semiconductor devices that may be identified using identification numbers. It may be desirable to identify and trace a semiconductor device from its fabrication to a final assembly of the associated semiconductor assembly, but also during the lifetime of the semiconductor assembly. Optical labels, such as e.g. Data Matrix (DMX) codes, may be used to display identification numbers of semiconductor devices. These labels need to be arranged visible in order to provide the displayed information that may be encoded by the optical label.

SUMMARY

According to an embodiment of a device, the device comprises a semiconductor element and a radio frequency identification tag configured to provide information about at least one of a property of the device and a property of a manufacturing of the device.

According to another embodiment of a device, the device comprises a housing, a semiconductor element at least partly enclosed by the housing and a radio frequency identification tag at least partly enclosed by the housing. The radio frequency identification tag is optically undetectable from outside of the housing.

According to an embodiment of a method, the method comprises: providing a device comprising a semiconductor element and a radio frequency identification tag, the radio frequency identification tag being configured to provide identification information for identifying at least one component of the device; reading the identification information; and bijectively mapping the identification information to information about at least one of a property of the device and a property of a manufacturing of the device.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

Figure 1:
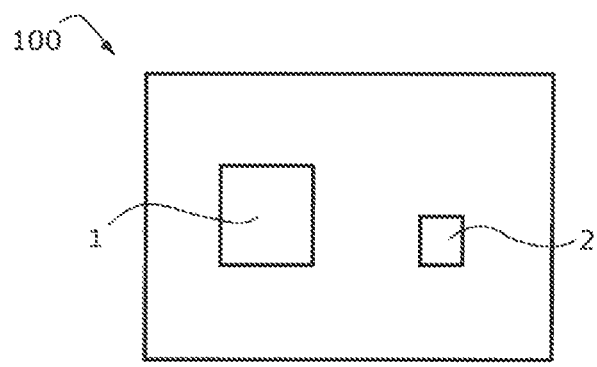
FIG. 1 illustrates a schematic diagram of a device 100 in accordance with the disclosure.

In the following detailed description, reference is made to the accompanying drawings. The drawings show by way of illustration specific aspects in which the invention may be practiced. In this regard, directional terminology, such as "top", "bottom", "front", "back", etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present invention. Hence, the following detailed description is not to be taken in a limiting sense, and the concept of the present invention is defined by the appended claims.

As employed in this specification, the terms "connected", "coupled", "electrically connected" and/or "electrically coupled" are not meant to necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various aspects and examples described herein may be combined with each other, unless specifically noted otherwise.

The devices and methods described herein may be based on a radio frequency identification (RFID) technique. RFID techniques may include wireless use of electromagnetic radiation to transfer data for identifying, tracking and/or tracing RFID tags that may be attached to or included in devices. For this purpose, an RFID tag may include electronically stored information. In one example, an RFID tag may be powered by electromagnetic induction from magnetic fields that may be produced near or by an RFID reader. The RFID tag may collect energy from interrogating radio waves and may use this energy to generate and transmit a response in form of radio frequency signals. Such RFID tag may be referred to as passive RFID tag. In a further example, an RFID tag may be powered by a power source, such as e.g. a battery, and may be referred to as active RFID tag. It is noted that the devices and methods described herein may preferably be based on passive RFID tags. In contrast to an optical label, an RFID tag needs not necessarily be arranged within a line of sight of an RFID reader. Rather, the RFID tag may also be embedded or enclosed in the device that is to be identified, tracked and/or traced.

The devices described herein may include one or more RFID tags that may be part of an RFID system. An RFID system may include RFID tags attached to objects that are to be identified, tracked and/or traced. In addition, the RFID system may include two-way radio transceivers that may transmit a radio signal to the RFID tag and read its response. Such transceivers may be referred to as RFID readers or interrogators.

In general, an RFID tag may be passive, active or battery-assisted passive. An active RFID tag may e.g. include an on-board battery and may periodically transmit an identification signal configured to identify the RFID tag and thus the device associated thereto. A battery-assisted passive RFID tag may e.g. include an on-board battery and may be activated in the presence of an RFID reader. A passive RFID tag may particularly not include a power source, but may draw required energy for operation from external radiation.

In one example, an RFID tag may be at least partly read-only. Such portion of the RFID tag may provide an identification number that may be read-only and used as a key into a database. The identification number may be configured to uniquely identify the RFID tag and thus a device associated therewith. Here, it may be reasonable to guarantee that the identification number is not changed by any circumstance. In a further example, an RFID tag may be at least partly read/write. That is, data may be written into a memory of the RFID tag, for example by the RFID system.

An RFID tag may include an integrated circuit for storing and processing information. In addition, the integrated circuit may be configured to modulate and demodulate a radio frequency signal and further to collect power from a radio frequency signal that may have been received from an RFID reader. The RFID tag may further include an antenna configured to receive and transmit radio frequency signals. In one example, the RFID tag and the antenna may be included (or integrated) in a single chip. Furthermore, the RFID tag may include a memory configured to store data. The memory of the RFID tag may include a read-only memory and/or a read/write memory. In one example, the memory may be at least partly non-volatile. The RFID tag may further include a chip-wired logic or a programmed or programmable data processor configured to process data.

An RFID system may include an RFID reader. In one example, an RFID reader may be passive, i.e. it may only receive radio signals from active RFID tags. In a further example, an RFID reader may be active, i.e. it may be configured to transmit interrogator signals and receive replies from passive RFID tags. An RFID reader may include a two-way radio transceiver configured to transmit a radio signal to the RFID tag and read its response.

During an operation of an RFID system, an RFID reader may transmit a (possibly encoded) radio signal to interrogate an RFID tag. The RFID tag may receive the request of the RFID reader and may respond by transmitting response data. That is, the RFID tag may be configured to provide the information to the RFID reader in a contactless way, in particular via a near field contactless communication link. Such response data may e.g. include data identifying the RFID tag as well as further information. The response data may merely represent a unique tag serial number, or may be product-related information such as a stock number, lot or batch number, production date, or other specific information as specified in the following.

Data provided by an RFID tag may include information about at least one of a property of a device including the RFID tag and a property of a manufacturing of the device. In one example, the property may refer to a material used for manufacturing at least one component of the device. Here, the property may e.g. relate to an identification of a wafer used for manufacturing a component of the device, a position on the wafer, properties of a Direct Copper Bonded (DCB) substrate included in the device, etc. In addition, the property may refer to a number and type of components included in the device, for example the number and types of IGBTs or other semiconductor or electronic components of the device. In a further example, the property may refer to a process used for manufacturing at least one component of the device. Here, the property may e.g. relate to at least one of x-ray pictures, electrical test data, mechanical test data, etc. In yet a further example, the property may refer to equipment used for manufacturing the device. Here, the property may e.g. relate to an employed bonder equipment, etc.

An RFID tag may be configured to provide a serial number (or module ID or tracking number) representing a unique code for identifying the respective device including the RFID tag. Such information may include at least one of a number, a letter, etc. In addition, an RFID tag may be configured to provide configuration data of at least one component of the device including the RFID tag. In general, such configuration data may specify the type and position of the device's components, processes for manufacturing the device, electric and magnetic parameters of the included components (e.g. a voltage/current response of an included sensor), etc. In yet a further example, an RFID tag may be configured to provide calibration data of at least one component of the device including the RFID tag. In particular, such configuration data may include information about a configuration of one or more components of the device, for example before assembling the individual components to form the device. In yet a further example, an RFID tag may be configured to provide test data of at least one component of the device including the RFID tag. In particular, such test data may include information about a test that has been performed on one or more components, for example before assembling the device.

An RFID tag included in a device in accordance with the disclosure may be optically undetectable from outside of the device. More particular, the RFID tag may be optically undetectable from outside of a housing that may also be a part of the device. The RFID tag may be specified as optically undetectable if the RFID tag is not arranged within a line of sight between the RFID tag and an optical detector configured to detect optical energy in the visible portion of the electromagnetic spectrum.

In one example, an RFID tag may be configured to operate in a low frequency range from about 30 kHz to about 300 kHz, more particular in a range from about 120 kHz to about 150 kHz. In this case, the RFID tag may be detected in a range up to about 10 cm. In a further example, an RFID tag may be configured to operate in a high frequency range from about 3 MHz to about 30 MHz, for example at a frequency of about 13.56 MHz. In this case, the RFID tag may be detected in a range from about 10 cm to about 1 m. In general, the range for detecting the RFID tag may depend on the specific design of the device including the RFID tag. Here, the signals transmitted by the RFID tag should be detectable outside of a periphery of the device that is to be identified, tracked and/or traced. It is understood that the read range may not exclusively depend on the frequency, but also on at least one of the chosen transmission type, the type of the employed antenna(s) and one or more properties of the transmission medium, for example environment and interfaces that the electromagnetic signal has to cross.

The devices described herein may include one or more semiconductor elements (or semiconductor chips) and thus may also be referred to as semiconductor devices. The semiconductor chips may be of different types and may be manufactured by different technologies. The semiconductor chips need not be manufactured from a specific semiconductor material and may also contain inorganic and/or organic materials that are not semiconductors, such as, for example, insulators, plastics or metals. In one example, the semiconductor chips may be made of or may include an elemental semiconductor material, for example Si, etc. In a further example, the semiconductor chips may be made of or may include a compound semiconductor material, for example SiC, SiGe, GaAs, etc.

The semiconductor chips may include one or more power semiconductors. For example, the power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), super junction devices, power bipolar transistors, etc. The devices described herein may further include semiconductor chips or integrated circuits configured to control and/or drive the integrated circuits of the power semiconductor chips. In particular, a power semiconductor chip may be a part of a power module that may be used in automotive electronics. For example, power modules may be used in the framework of Hybrid and Electric Vehicles (HEV). Here, a power module may e.g. be included in a main inverter configured to control an electric motor.

The devices described herein may include a housing that may at least partly enclose an RFID tag and/or a semiconductor element of the device. The housing may be arranged such that the RFID tag may be optically undetectable from outside of the housing. In one example, the housing may include an encapsulation material that may be electrically insulating and may form an encapsulation body. The encapsulation material may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material, etc. Various techniques may be used to encapsulate components of the device with the encapsulation material, for example at least one of compression molding, injection molding, powder molding, liquid molding, lamination, etc. In a further example, the housing may include one or more casings that may be at least partly hollow. Multiple casing may enclose each other. That is, one casing may be arranged inside of another casing. For example, one or more of the casings may be made of at least one a ceramic material, a plastic material, a metal, etc.

Figure 2:
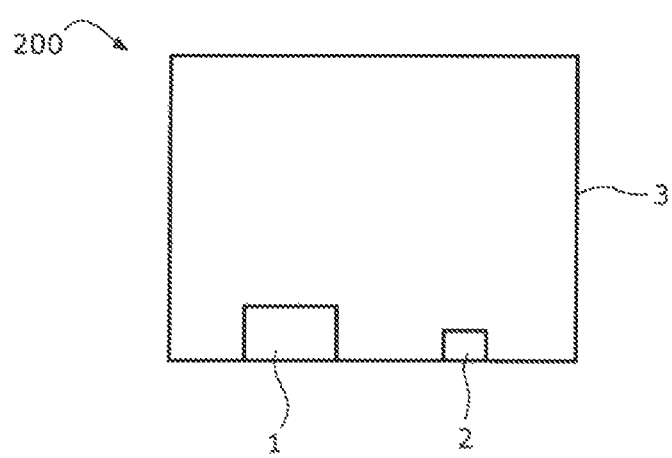
FIG. 2 schematically illustrates a cross-sectional view of a further device 200 in accordance with the disclosure.

FIGS. 1 and 2 schematically illustrate devices 100 and 200 as basic concepts of the present invention. Hence, the devices 100 and 200 are shown in a general manner and may include further components that are not illustrated for the sake of simplicity. For example, each of the devices 100 and 200 may additionally include one or more components of other devices in accordance with the disclosure and described herein. More detailed devices similar to the devices 100 and 200 are described below.

FIG. 1 illustrates a schematic diagram of a device 100 in accordance with the disclosure. The device 100 includes a semiconductor element 1 and an RFID tag 2. The RFID tag 2 is configured to provide information about at least one of a property of the device 100 and a property of a manufacturing of the device 100. Each of the semiconductor element 1 and the RFID tag 2 may be of arbitrary type. In this regard, reference may be made to foregoing comments on possible implementations of such components.

During an operation of the device 100, a manufacturing of the device 100 and/or an assembly of the device 100 with other components within a bigger system, it may be desirable to access information provided by the RFID tag 2. Exemplary methods for accessing such information are e.g. described in connection with FIGS. 6 and 7. Since the information included in the RFID tag 2 may be accessed via a near field contactless communication link, the RFID tag 2 is not necessarily required to be optically detectable. Rather, the RFID tag 2 may be arranged at an arbitrary location of the device 100. For detecting the RFID tag 2 it may thus not be necessary to open or dismount any of the components of the device 100. In contrast to this, using an optical label instead of the RFID tag 2 would require the optical label to be arranged optically detectable. Depending on the overall design of the device 100, usage of an optical label may require dismounting components or opening elements of the device 100 in order to optically access the information displayed by the optical label.

FIG. 2 schematically illustrates a cross-sectional view of a further device 200 in accordance with the disclosure. The device 200 includes a housing 3 and a semiconductor element 1 that is at least partly enclosed by the housing 3. The device 200 further includes an RFID tag 2 that is also at least partly enclosed by the housing 3. In the example of FIG. 2, the housing 3 is illustrated to fully enclose the semiconductor element 1 and the RFID tag 2. In further examples, the housing 3 may at least partly be open to the environment. Further, it is understood that the components arranged inside the housing 3 may be electrically accessible from outside of the housing 3. The RFID tag 2 is optically undetectable from outside of the housing 3. Using the RFID tag 2 instead of an optical label may result in effects as explained in connection with FIG. 1.

Figure 3:
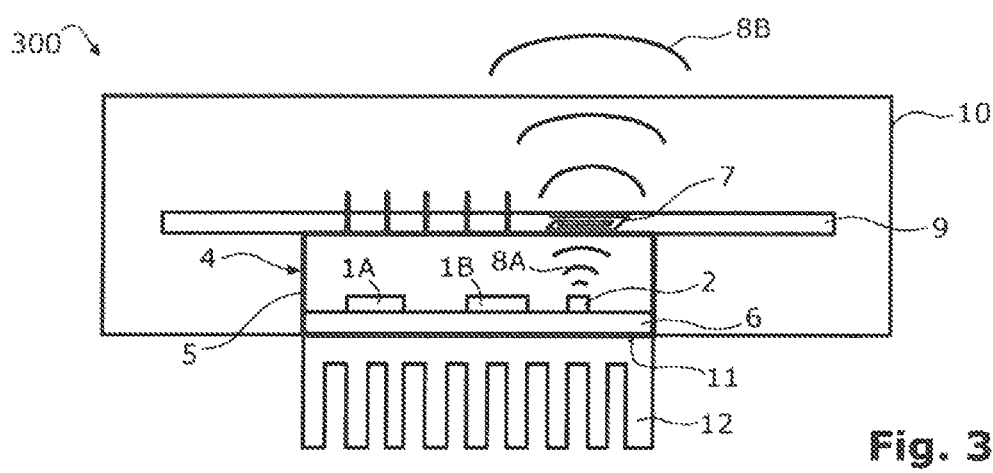
FIG. 3 schematically illustrates a cross-sectional view of a further device 300 in accordance with the disclosure.

FIG. 3 schematically illustrates a cross-sectional view of a further device 300 in accordance with the disclosure. The device 300 may be seen as a more detailed version of the devices 100 and 200 shown in FIGS. 1 and 2. For example, the device 300 may represent an inverter or a part of an inverter. The device 300 may comprise a module 4 including a first casing 5 that may e.g. be made of at least one of a ceramic material, a plastic material, etc. The first casing 5 may house an interface 6 over which a first semiconductor element 1A, a second semiconductor element 1B and an RFID tag 2 may be arranged. The first casing 5 may be at least partly hollow, but may further include a layer of paste (not illustrated) that may at least partly cover at least one of the semiconductor elements 1A, 1B and the RFID tag 2. In one example, the device 300 may be a power application, such as e.g. a main inverter for an HEV, wherein the module 4 may then correspond to a power module and at least one of the semiconductor chips 1A, 1B may be based on a power semiconductor. It is understood that the device 300 may include further components that are not illustrated for the sake of simplicity. For example, the device 300 may also include at least one of a control board, a driver board, a current sensor, a voltage sensor, integrated circuits, etc.

The RFID tag 2 may be used for uniquely identifying the device 300 such that information about at least one of a property of the device 300 and a property of a manufacturing of the device 300 may be provided on the basis of such identification. In the example of FIG. 3, the device 300 merely includes one module 4. However, in further examples, the device 300 may include an arbitrary number of further arbitrary modules or components (e.g. board sensors, connectors, etc.) depending on the overall design of the device 300. In such cases, the RFID tag 2 may particularly be used for uniquely identifying the module 4, instead of the device 300. Here, the device 300 may include further RFID tags (not illustrated) that may be used for uniquely identifying the further components of the device 300. The RFID tag 2 may include a memory (not illustrated) to store relevant data and an antenna (not illustrated) to receive and transmit radio frequency signals. In addition, the device 300 may include a booster antenna 7 that may be arranged inside the module 4 or over a periphery of the module 4. That is, the booster antenna 7 may be a part of the module 4 or not. The RFID tag 2 may be configured to transmit a radio frequency signal 8A that may include information requested by an RFID reader (not illustrated). For this purpose, the RFID tag 2 may include an (integrated) antenna (not illustrated) that may be configured to transmit the radio frequency signal 8A to the booster antenna 7. The booster antenna 7 may be configured to receive and amplify the radio frequency signal 8A and further to transmit the amplified radio frequency signal 8B to an RFID reader.

The module 4 may be arranged over a PCB (or driver PCB) 9 that may be configured to provide an electrical coupling between the module 4 and further components (not illustrated) that may also be arranged over the PCB 9. The device 300 may further include a second housing 10 that may at least partly enclose the first housing 5 and the PCB 9. In the example of FIG. 3, the second housing 10 is illustrated to completely enclose the first housing 5 and the PCB 9. In further examples, the second housing 10 may at least partly be open to the environment. The device 300 may further include one or multiple electrical terminals (not illustrated) that are configured to provide an electrical connection from the outside of the device 300 to at least one of the components enclosed by the first housing 5 and/or the second housing 10. For example, such electrical connections may provide the opportunity to electrically contact at least one of the semiconductor chips 1A, 1B and the PCB 9.

A surface 11 of the module 4 (or a surface of the second housing 10) may be coupled to a heatsink 12 that may be a part of the device 300 or not. The interface 6 of the module 4 may be configured to provide an increased thermal conduction between components of the module 4 and the heatsink 12.

Figure 4:
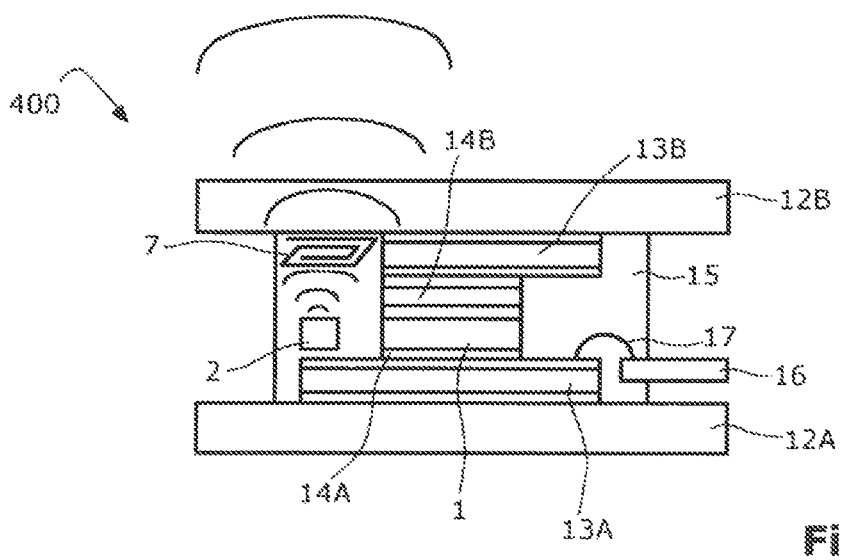
FIG. 4 schematically illustrates a cross-sectional view of a further device 400 in accordance with the disclosure.

FIG. 4 schematically illustrates a cross-sectional view of a further device 400 in accordance with the disclosure. The device 400 may be seen as a more detailed version of the devices 100 and 200 of FIGS. 1 and 2. Comments made in connection with the example of FIG. 3 may also hold true for the example of FIG. 4. For example, the device 300 may represent an inverter or a part of an inverter. The device 400 may include a semiconductor element 1, for example a power semiconductor chip. The device 400 may further include a first DCB (Direct Copper Bonded) substrate 13A (exemplarily illustrated by three stacked layers) that may be arranged over a lower surface of the semiconductor element 1 and a second DCB substrate 13B (exemplarily illustrated by three stacked layers) that may be arranged over an upper surface of the semiconductor element 1. A first layer stack 14A (exemplarily illustrated by one layer on the lower side of the semiconductor element 1) may include one or more electrically conductive layers that may provide an electrical connection between electrical contacts (not illustrated) of the semiconductor element 1 and the first DCB substrate 13A. In addition, a second layer stack 14B (exemplarily illustrated by three layers on the upper side of the semiconductor element 1) may include one or more electrically conductive layers that may provide an electrical connection between electrical contacts (not illustrated) of the semiconductor element 1 and the second DCB substrate 13B. For example, layers of the layer stacks 14A, 14B may be manufactured from at least one of a solder material, copper, copper alloy, etc.

The device 400 may further include an RFID tag 2 and a booster antenna 7. As can be seen from FIG. 4, it may be difficult or even impossible to arrange a visible optical label inside the device 400. In particular, it may be difficult or even impossible to arrange a visible optical label (which may particularly be configured to uniquely identify the module 4) over the module 4. The device 400 may further include an encapsulation material 15 that may at least partly encapsulate at least one of the semiconductor element 1, the RFID tag 2 and the DCB substrates 13A, 13B. For example, the encapsulation material 15 may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material, etc.

The device 400 may further include an electrical contact element 16 that may at least partly protrude out of the encapsulation material 15. A bond wire 17 may provide an electrical connection between the first DCB 13A and the electrical contact element 16. For example, the bond wire 17 may be fabricated from at least one of aluminum, copper, silver, gold, etc. The electrical contact element 16 may thus be used to electrically contact the semiconductor element 1 from outside of the encapsulation material 15.

A first heatsink 12A may be connected to a lower surface of the device 400 (or a lower surface of the first DCB 13A). In addition, a second heatsink 12B may be connected to an upper surface of the device 400 (or an upper surface of the second DCB 13B). One or both of the heatsinks 12A, 12B may be regarded as a part of the device 400 or not. It is understood that the device 400 may include further components which are not illustrated for the sake of simplicity. For example, the device 400 may represent a part of an inverter and may further include additional elements like e.g. connectors, a driver board, a control board, etc.

Figure 5:
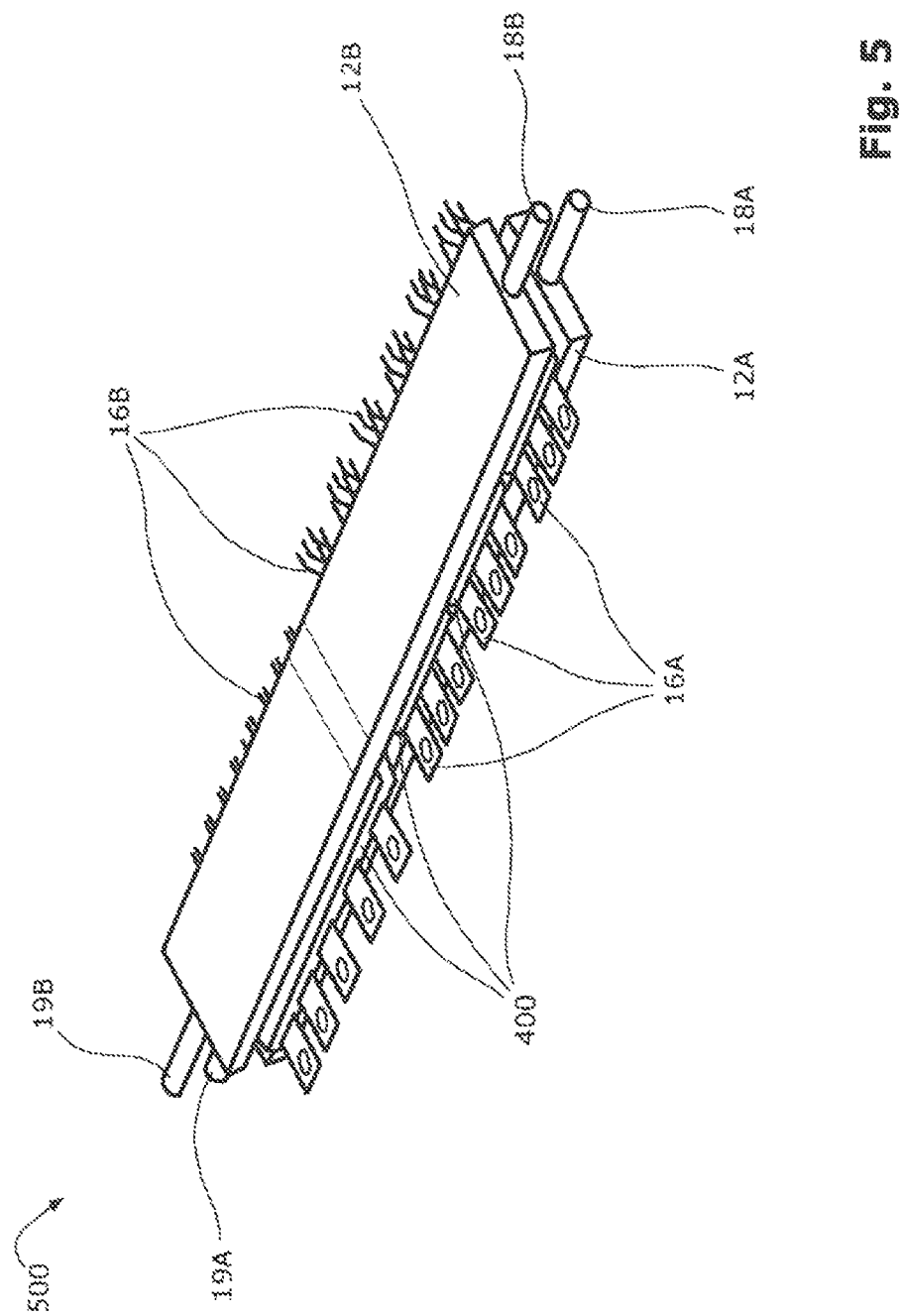
FIG. 5 illustrates a perspective view of a further device 500 in accordance with the disclosure.

FIG. 5 illustrates a perspective view of a device 500 in accordance with the disclosure. The device 500 may include multiple modules 400 that may be arranged between a first heatsink 12A and a second heatsink 12B. Each of the modules 400 may be similar to the device 400 of FIG. 4 and may include multiple external contact elements 16A, 16B configured to provide an electrical connection to components arranged inside the modules 400. Each of the heatsinks 12A, 12B may include an input 18A, 18B and an output 19A, 19B configured to receive and output a cooling liquid, respectively. For example, the cooling liquid may include at least one of water, oil, etc., and may flow through the respective heatsink 12A, 12B in order to cool the modules 400 arranged between the heatsinks 12A, 12B.

Figure 6:
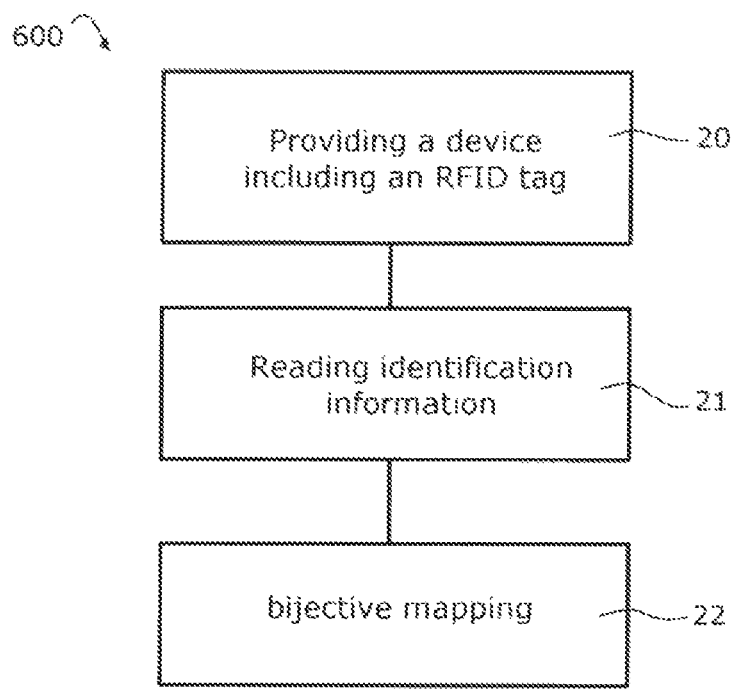
FIG. 6 is a block diagram of a method 600 for operating a device in accordance with the disclosure.

FIG. 6 is a block diagram of a method 600 for operating a device in accordance with the disclosure. The method 600 includes an act 20 of providing a device including a semiconductor element and an RFID tag, wherein the RFID tag is configured to provide identification information for identifying at least one component of the device. The method 600 further includes an act 21 of reading the identification information. The method 600 further includes an act 22 of bijectively mapping the identification information to information about at least one of a property of the device and a property of a manufacturing of the device. The method 600 is not restricted to the acts 20 to 22, but may also include further acts. For example, the method 600 may be extended by one or more of the acts described in connection with FIG. 7.

Figure 7:
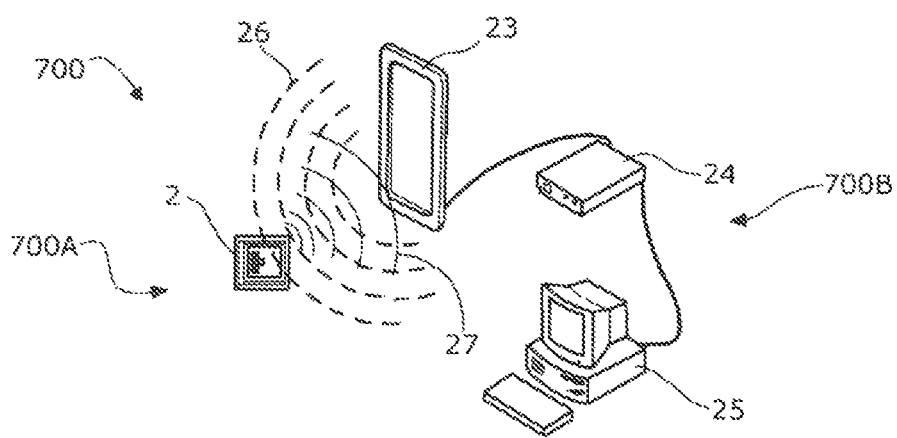
FIG. 7 schematically illustrates a system 700 for performing a method in accordance with the disclosure.

FIG. 7 schematically illustrates a system 700 for performing a method in accordance with the disclosure. For example, the system 700 may be configured to perform the method 600 of FIG. 6. The system 700 may include a device 700A that may be similar to any of the devices in accordance with the disclosure described herein. For the sake of simplicity, only an RFID tag 2 of the device 700A is illustrated. The system 700 may further include a subsystem 700B that may be configured to read and process information provided by the RFID tag 2. The subsystem 700B may include an antenna 23, an RFID reader (or interrogator) 24 and a unit for processing data, such as e.g. a computer 25. For example, the RFID reader 24 may include a two-way radio transceiver. The components of the subsystem 700B may be coupled with each other such that data may be exchanged between them.

During an operation of the system 700, the device 700A may be placed at a distance to the subsystem 700B such that signals transmitted by the RFID tag 2 may be detected by the subsystem 700B and vice versa. The RFID reader 24 may transmit a radio frequency signal 26 to the RFID tag 2 via the antenna 23 requesting information that may be stored by the RFID tag 2. The RFID tag 2 may respond with a radio frequency signal 27 that may include information that may be stored in a memory (not illustrated) of the device 700A. The information may include any of the data that has been discussed before. For example, the information may include an identification information to uniquely identify the device 700A. In a further example, the RFID reader 24 may request information related to a test, a calibration and/or a configuration of the device 700A.

The RFID reader 24 may transmit the information received from the RFID tag 2 to the computer 25 that may further process this information. In one example, a software on the computer 25 may bijectively map information identifying the device 700A to an entry of a database. The entry of the database may include data about at least one of a property of the device and a property of a manufacturing of the device. In particular, the data may include information about at least one of a material used for manufacturing the device 700A, a process used for manufacturing the device 700A, and an equipment used for manufacturing the device 700A. In a further example, a software on the computer 25 may display or analyze data that may be related to a test, a calibration and/or a configuration of one or more components of the device 700A. The test/calibration/configuration data may be provided by the RFID tag 2 and/or stored in a database entry.

While a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ from that illustrated herein.

Although specific aspects have been illustrated and described herein, it will be appreciated by those of ordinary skill in the art that a variety of alternate and/or equivalent implementations may be substituted for the specific aspects shown and described without departing from the concept of the invention. This application is intended to cover any adaptations or variations of the specific aspects discussed herein. Therefore, it is intended that this invention be limited only by the claims and the equivalents thereof.

What is claimed is:

1. A device, comprising:
   a power semiconductor;
   a radio frequency identification tag configured to provide information about a property of a manufacturing of the device, wherein the property is related to a test, a calibration and/or a configuration of one or more components of the device;
   a housing at least partly enclosing the radio frequency identification tag such that the radio frequency identification tag is optically undetectable from outside of the housing; and
   at least one heatsink coupled to the housing.

2. The device of claim 1, wherein the housing comprises an encapsulation material comprising at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, and a laminate material.

3. The device of claim 1, wherein the housing comprises at least one casing comprising at least one of a ceramic material, a plastic material and a metal.

4. The device of claim 1, wherein the property of a manufacturing of the device further comprises at least one of a process used for manufacturing the device and an equipment used for manufacturing the device.

5. The device of claim 1, wherein the radio frequency identification tag is configured to provide the information to a reader in a contactless way.

6. The device of claim 1, wherein the radio frequency identification tag comprises:
   a memory configured to store the information; and
   an antenna configured to receive and transmit radio frequency signals.

7. The device of claim 1, wherein the radio frequency identification tag comprises a passive radio frequency identification tag.

8. The device of claim 1, wherein the radio frequency identification tag is configured to uniquely identify the device.

9. The device of claim 1, further comprising
a printed circuit board, wherein the housing is mounted over the printed circuit board.

10. A method, comprising:
providing a device comprising a power semiconductor, a radio frequency identification tag, the radio frequency identification tag being configured to provide identification information for identifying at least one property of a manufacturing of the device, the property being related to a test, a calibration and/or a configuration of one or more components of the device, a housing at least partly enclosing the radio frequency identification tag such that the radio frequency identification tag is optically undetectable from outside of the housing, and at least one heatsink coupled to the housing;
reading the identification information; and
bijectively mapping the identification information to information about at least one of a property of the device and a property of a manufacturing of the device.

11. The method of claim 10, wherein reading the identification information comprises:
transmitting a radio frequency signal from a reader to the radio frequency identification tag; and
transmitting a response from the radio frequency identification tag to the reader, wherein the response is based on the identification information.

12. The method of claim 10, wherein the bijectively mapping comprises mapping the identification information to an entry of a database.

\* \* \* \* \*